(12) United States Patent
Lambertson

(10) Patent No.: US 6,529,038 B2
(45) Date of Patent: Mar. 4, 2003

(54) ANTIFUSE PROGRAMMING METHOD

(75) Inventor: Roy T. Lambertson, Mountainview, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/736,898

(22) Filed: Dec. 13, 2000

(65) Prior Publication Data

US 2002/0070754 A1 Jun. 13, 2002

(51) Int. Cl.[7] .............................................. H03K 19/173
(52) U.S. Cl. .............................. 326/38; 326/40; 326/41; 326/39; 327/525
(58) Field of Search ............................. 326/38, 39, 40, 326/41; 327/525; 257/530

(56) References Cited

U.S. PATENT DOCUMENTS

| | | | | |
|---|---|---|---|---|
| 4,899,205 A | * | 2/1990 | Hamdy et al. | 257/530 |
| 5,008,855 A | * | 4/1991 | Eltoukhy et al. | 365/96 |
| 5,126,282 A | * | 6/1992 | Chiang et al. | 438/467 |
| 5,272,388 A | * | 12/1993 | Bakker | 327/525 |
| 5,302,546 A | * | 4/1994 | Gordon et al. | 438/10 |
| 5,371,414 A | * | 12/1994 | Galbraith | 327/525 |
| 5,525,909 A | * | 6/1996 | McCollum | 324/550 |

* cited by examiner

*Primary Examiner*—Karl D. Frech
*Assistant Examiner*—Steven S. Paik
(74) *Attorney, Agent, or Firm*—Sierra Patent Group, Ltd.

(57) ABSTRACT

A method for programming antifuses includes applying a programming pulse having a magnitude equal to the programming potential across the conductive electrodes of the antifuse such that the more positive potential is applied to the upper electrode of the antifuse than to the lower electrode of the antifuse. The disruption of the antifuse material is sensed and the programming pulse is extended for a fixed period of time following the disruption of the antifuse material. The programming pulse is followed by a soak pulse having a polarity having a polarity such that a more negative potential is applied to the upper electrode of the antifuse than to the lower electrode of the antifuse.

17 Claims, 2 Drawing Sheets

ANTIFUSE PROGRAMMING METHOD

BACKGROUND OF THE INVENTION

1. Field of the Invention

The present invention relates to antifuse technology. More specifically, the present invention relates to methods for programming antifuse devices.

2. The Prior Art

Antifuse devices are known in the art. Antifuse devices comprise a pair of conductive electrodes separated by at least one layer of antifuse material and may include one or more diffusion barrier layers. Prior to programming, antifuses exhibit very high resistance between the two electrodes and may be considered to be open circuits. A programming process disrupts the antifuse material and creates a low-impedance connection between the two conductive electrodes.

Antifuses are generally classifiable in two categories. A first type of antifuse has a doped region in a semiconductor substrate as its lower electrode and a layer of metal or doped polysilicon as its upper electrode. The antifuse material comprises one or more layers of silicon nitride or silicon dioxide. This type of antifuse is referred to as a substrate antifuse.

A second type of antifuse has a first metal layer disposed above and insulated from a semiconductor substrate as its lower electrode and a second metal layer as its upper electrode. The antifuse material comprises a layer of a material such as amorphous silicon and may be accompanied by one or more barrier layers separating it from the first and/or second metal layers. This type of antifuse is referred to as a metal-to-metal antifuse.

Numerous methods for programming antifuses are known in the art. According to a first prior-art antifuse programming method, direct-current programming potential is applied across the conductive electrodes for a period of time sufficient to disrupt the antifuse material and create at least one conductive filament therethrough. The conductive filament is formed from material from either one or both of the conductive electrodes or the barrier material. An illustrative example of such an antifuse programming method is disclosed in U.S. Pat. No. 4,899,205 to Hamdy et al.

According to another prior-art antifuse programming method, a series of programming potential pulses are applied across the electrodes of the antifuse as the resistance of the programmed antifuse is measured. The number of pulses is determined by the measured resistance of the antifuse. An illustrative example of such an antifuse programming method is disclosed in U.S. Pat. No. 5,008,855 to Eltoukhy et al.

Other methods for programming antifuses are known. Illustrative non-exhaustive examples of such programming methods are disclosed in U.S. Pat. No. 5,126,282 to Chiang et al. and U.S. Pat. No. 5,272,388 to Bakker et al.

According to one example of a prior-art antifuse programming method, a programming pulse is applied across the antifuse electrodes. The pulse has a magnitude equal to a programming potential and has its most positive potential applied to the upper electrode of the antifuse. The programming pulse is followed by a soak pulse having a magnitude equal to from between about 50% to about 80% of the magnitude of the programming potential. The most negative potential of the soak pulse is applied to the upper electrode of the antifuse. The sequence of programming and soak pulses are repeated until the antifuse breaks down after which they are repeated a fixed number of times (e.g., five times).

While these prior-art methods have proved to be successful for programming antifuses, there remains room for improvement with respect to both the reliability of the programmed antifuse and the time it takes to perform the programming of the antifuse.

BRIEF DESCRIPTION OF THE INVENTION

The present invention is a method for programming antifuses. A programming pulse having a magnitude equal to the programming potential is applied across the conductive electrodes of the antifuse such that the more positive potential is applied to the upper electrode of the antifuse. The disruption of the antifuse material is sensed by an increase in the flow of current. The programming pulse is extended for a fixed period of time following the current increase indicating the disruption of the antifuse material. The programming pulse is followed by a soak pulse. The magnitude of the soak pulse is equal to or less than the magnitude of the programming potential. The polarity of the soak pulse is such that the more negative potential is applied to the upper electrode of the antifuse. After the soak pulse, a program verification pulse may be applied to the antifuse to determine if its resistance is low enough. The magnitude of the programming verification pulse is less than that of the programming and soak pulses and may preferrably be from about 20% to about 30% of the magnitude of the programming and soak pulses. The polarity of the programming verification pulse may be such that either the more positive or more negative potential may be applied to the upper conductive electrode of the antifuse.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

The present invention is a method for programming antifuses. Antifuses are usually disposed in integrated circuits having other circuitry with which the antifuses are employed to form programmable connections between circuit elements. Integrated circuits containing antifuses are also provided with on-chip circuitry for addressing the antifuses to be programmed. This circuitry is used by antifuse programming equipment that utilizes the on-chip circuitry to address the antifuses to be programmed and then to provide the programming pulses to the selected antifuses. Such equipment and on-chip circuitry is well known in the art and is beyond the scope of the present invention. Descriptions of the on-chip programming circuitry and the antifuse programming equipment herein are thus brief to avoid overcomplicating the disclosure and thereby obscuring the description of the present invention.

Figure 1:
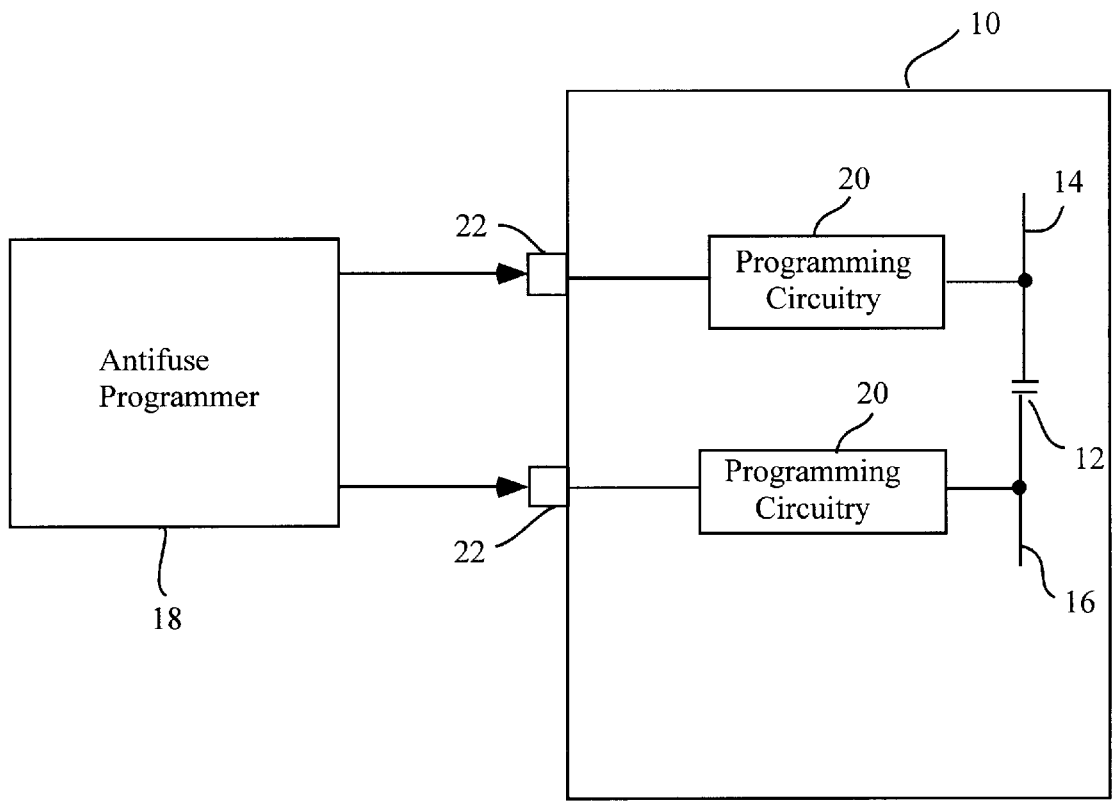
FIG. 1 is a diagrammatic representation of a setup for programming an antifuse.

Referring first to FIG. 1, a diagrammatic representation shows an integrated circuit 10 containing antifuse 12. Antifuse 12 is initially unprogrammed. As will be immediately appreciated by persons of ordinary skill in the art, antifuse 12 may perform one of numerous functions in integrated circuit 10. As an illustrative example in FIG. 1, it is assumed that the function of antifuse 12 is to selectively connect together interconnect conductors 14 and 16. Interconnect conductors 14 and 16 may be used to selectively make connections between circuit nodes (not shown) in integrated circuit 10. For purposes of this disclosure, it is assumed that interconnect conductor 14 is electrically connected to the upper conductive electrode of antifuse 12 and that interconnect conductor 16 is electrically connected to the lower conductive electrode of antifuse 12.

An antifuse programmer 18 is shown electrically coupled to integrated circuit 10 in FIG. 1. Access to antifuse 12 within integrated circuit 10 by antifuse programmer 18 is provided from programming circuitry 20 to the integrated circuit via I/O pins 22 of integrated circuit 10 and finally to interconnect conductors 14 and 16. As is well known by persons of ordinary skill in the art, antifuse programmer 18 provides signals to programming circuitry 18 to cause programming and soak potentials to be applied from antifuse programmer 18 across antifuse 12 in order to program it. While two I/O pins 22 are shown associated with integrated circuit 10 for purposes of illustrating the present invention, persons of ordinary skill in the art will readily appreciate that the number of I/O pins needed to accomplish the programming of antifuses in integrated circuit 10 will vary as does the architecture of the integrated circuits and the illustrative example of FIG. 1 is not to be construed as limiting.

Figure 2:
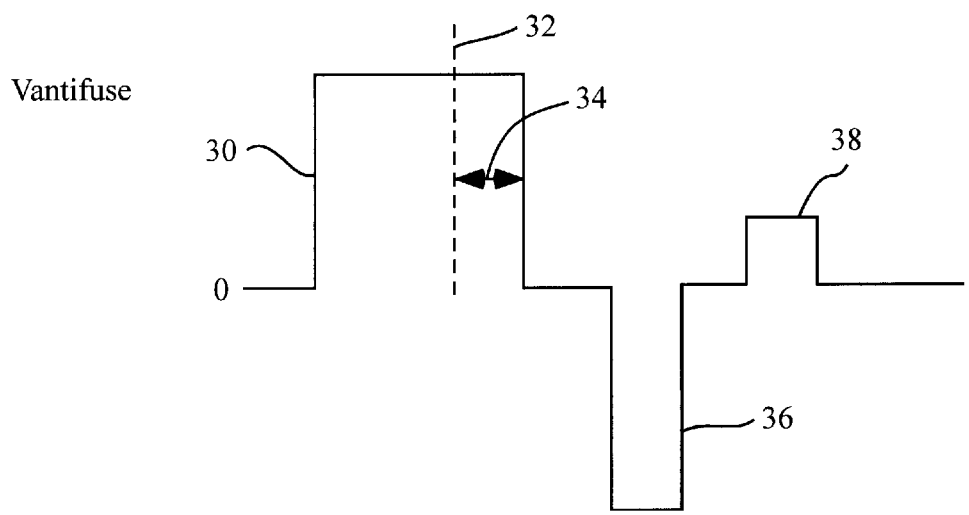
FIG. 2 is a representation of the programming and soak pulse sequence used to program an antifuse according to the present invention.

Referring now to FIG. 2, a representation of the programming and soak pulses to be applied to antifuse 12 of FIG. 1 by antifuse programmer 18 is shown. Those of ordinary skill in the art will observe that antifuse programmers usually provide positive voltages to program antifuses and that FIG. 2 is meant to show the relative polarities of the potential applied across the antifuse during programming. For example, if 10 volts is used to program an antifuse, the programming pulse will place 10 volts on the top electrode and zero volts at the bottom electrode, and the soak pulse will place zero volts on the top electrode and 10 volts at the bottom electrode.

According to the present invention, a programming pulse 30 having a magnitude equal to the programming potential Vpp is applied across the conductive electrodes of the antifuse 12 such that the more positive potential is applied to the upper electrode of the antifuse 12 through interconnect conductor 14. Initially, only a small amount of current (perhaps about 1 μa) flows through antifuse 12. At some point, the antifuse material in antifuse 12 is disrupted by the programming potential, and the amount of current drawn by antifuse 12 increases dramatically (e.g., to a current on the order of 10 mA). This point is illustrated at dashed vertical line 32 in FIG. 2.

The increase in current is sensed by circuitry in antifuse programmer 18 and the programming pulse 30 is extended for a fixed period of time as indicated by arrow 34 following the current increase indicating the disruption of the antifuse material. The fixed period of time illustrated at arrow 34 may be from about 200 μsec to 1 ms, and is preferrably about 1 ms.

According to the present invention, the programming pulse is followed by a soak pulse, illustrated at reference numeral 36 in FIG. 2. The magnitude of the soak pulse 36 may be equal to or less than the magnitude of the programming potential. As illustrated in FIG. 2, the polarity of the soak pulse 36 is opposite that of the programming pulse such that the more positive potential is applied to the lower electrode of the antifuse through interconnect conductor 16.

After the programming pulse 30 and the soak pulse 36 have been applied to the antifuse to program it, a program verification pulse 38 may be applied across antifuse 12 of FIG. 1 as shown in FIG. 32 to assure that its on resistance is within acceptable limits. In order to avoid "disturbing" antifuse 12, the program verification pulse has a lower magnitude than that of either the programming pulse 30 or the soak pulse 36. As presently contemplated, the magnitude of program verification pulse 38 may be from about 20% to about 30% of the magnitude of either the programming pulse 30 or the soak pulse 36.

Figure 3:
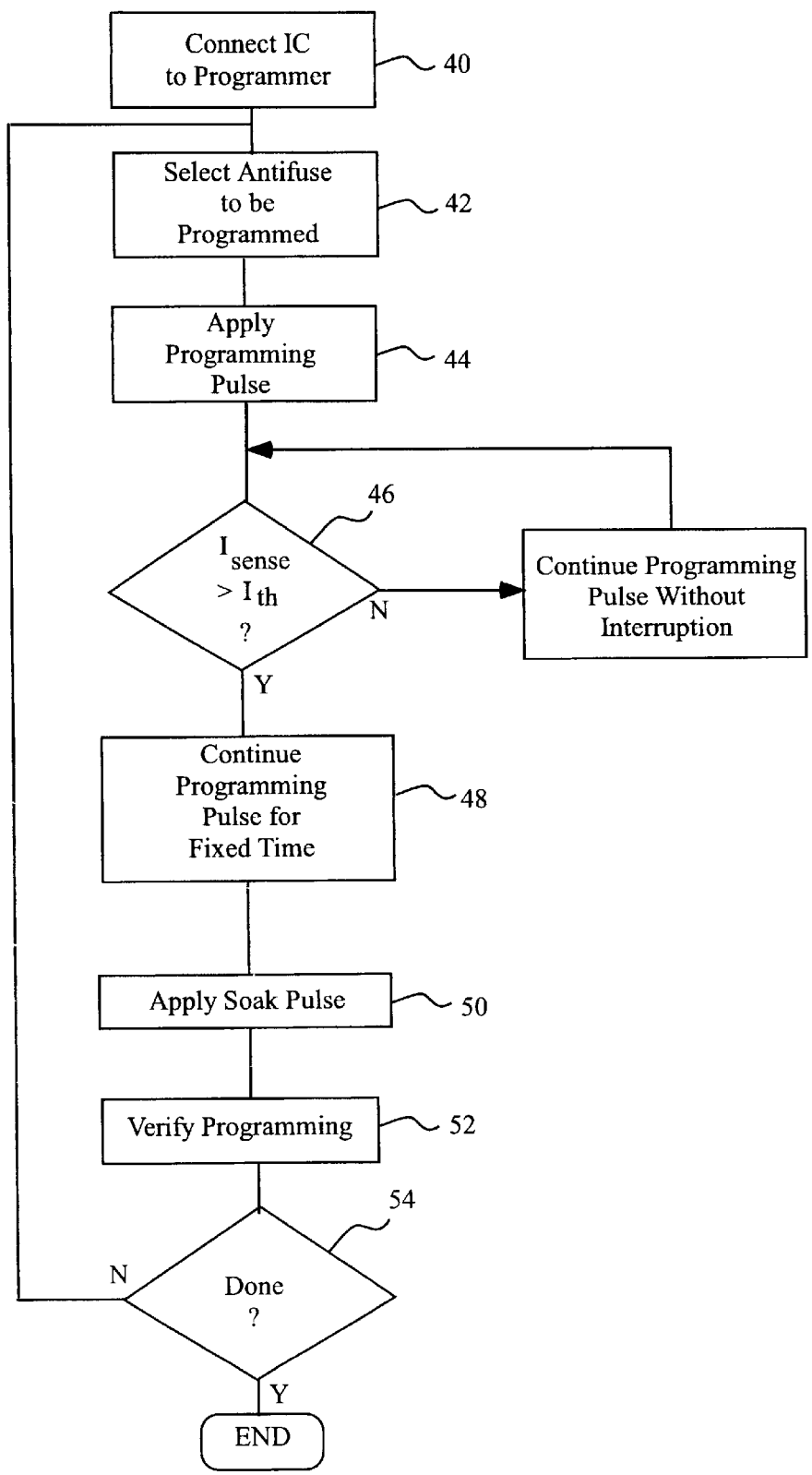
FIG. 3 is a flow diagram illustrating the method for programming an antifuse according to the present invention.

Referring now to FIG. 3, a flow chart illustrates the antifuse programming method of the present invention. The flow chart of FIG. 3 assumes that an integrated circuit may have a plurality of antifuses to be programmed. The discussion of the method illustrated by FIG. 3 assumes the use of the arrangement depicted in FIG. 1 and reference numeral designations thereto will be made in the following description.

First, at block 40, the integrated circuit 10 is connected to the antifuse programmer 18 that has been configured to program antifuses in the particular type of integrated circuit 10. Next, at block 42, an antifuse 12 is selected to be programmed. As will be appreciated by persons of ordinary skill in the art, this selection is made by the antifuse programmer 18 using available programming tools and a net list provided by the circuit designer defining the circuit to be programmed into the integrated circuit 10. The antifuse programmer 18 sends signals via I/O pins 22 into programming circuitry 20 on integrated circuit 10 to define a programming voltage path to antifuse 12.

After the programming voltage path to antifuse 12 has been defined, antifuse programmer 18 applies a programming pulse to the antifuse 12. Next, at decision diamond 46, it is determined whether the antifuse material has been disrupted by sensing the increase in current flow signifying such disruption. If not, the programming pulse is continued, if so, the programming pulse is continued for a fixed time period after which it is terminated.

After the programming pulse is terminated, a soak pulse is applied to antifuse for a fixed time period at block 50. According to the present invention, the soak pulse may be applied for the same fixed time period as the portion of the programming pulse applied after disruption of the antifuse material in antifuse 12 has been sensed because the portion of the programming pulse prior to the disruption of the antifuse material in antifuse 12 does not contribute to the formation of the filament.

After termination of the soak pulse, a programming verification pulse may be applied to antifuse 12 at block 52 to determine if the antifuse was adequately programmed (i.e., its on resistance is sufficiently low). If the antifuse fails the verification, other steps (not shown) may be performed to attempt to reprogram it or to mark the integrated circuit 10 as defective. If the antifuse is verified as successfully programmed, a determination is made at decision diamond 54 whether there are other additional antifuses in integrated circuit 10 that need to be programmed. If, so, control returns to block 42 to select the next antifuse to be programmed. If not, the programming process ends at block 54.

While the present invention has been disclosed using a programming pulse having a positive polarity at the top electrode and a soak pulse having a negative polarity at the top electrode, antifuse programming methods according to the present invention also include embodiments where the polarities of these pulses are reversed, i.e., where a programming pulse has a positive polarity at the top electrode and a soak pulse has a negative polarity at the top electrode.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for programming an antifuse having a lower conductive electrode separated from an upper conductive electrode by an antifuse material including:

applying an initial programming pulse of variable duration across the antifuse such that a more positive potential is applied to the upper electrode of the antifuse than to the lower electrode of said antifuse;

sensing disruption of the antifuse material during said initial programming pulse;

continuing application of said initial programming pulse for a fixed period of time without interruption following said disruption of the antifuse material; and applying a soak pulse across said antifuse, said soak pulse having a polarity such that a more negative potential is applied to said upper electrode of the antifuse than to said lower electrode of said antifuse.

2. The method of claim 1 wherein said fixed period of time is between about 200 μsec and about 1 msec.

3. The method of claim 1 wherein said fixed period of time is about about 1 msec.

4. The method of claim 1 wherein said soak pulse has a duration of between about 200 μsec and about 1 msec.

5. The method of claim 1 wherein said soak pulse has a duration of about 1 msec.

6. The method of claim 1 wherein said soak pulse is followed by a program verification pulse.

7. The method of claim 6 wherein said program verification pulse has a magnitude lower than the magnitude of said programming pulse.

8. The method of claim 7 wherein said program verification pulse has a magnitude of between about 20% and about 30% of the magnitude of said programming pulse.

9. The method of claim 1, wherein said variable duration is dependent upon the length of time required for said disruption of the antifuse material.

10. A method for programming an antifuse having a lower conductive electrode separated from an upper conductive electrode by an antifuse material, the antifuse disposed within an integrated circuit, the method including:

providing an antifuse programmer configured to apply an initial programming pulse of variable duration across the antifuse such that a more positive potential is applied to the upper electrode of the antifuse than to the lower electrode of said antifuse, and configured to sense disruption of the antifuse material, and configured to apply a soak pulse across said antifuse such that a more negative potential is applied to said upper electrode of the antifuse than to said lower electrode of said antifuse;

providing electrical connections between the antifuse programmer and the integrated circuit within which the antifuse is disposed;

applying said initial programming pulse from said antifuse programmer across said antifuse;

sensing within said antifuse programmer disruption of the antifuse material in said antifuse during said initial programming pulse;

continuing application of said initial programming pulse from said antifuse programmer for a fixed period of time without interruption following said disruption of said antifuse material; and applying a soak pulse from said antifuse programmer across said antifuse.

11. The method of claim 10 wherein said fixed period of time is between about 200 μsec and about 1 msec.

12. The method of claim 10 wherein said fixed period of time is about about 1 msec.

13. The method of claim 10 wherein said soak pulse has a duration of between about 200 μsec and about 1 msec.

14. The method of claim 10 wherein said soak pulse has a duration of about 1 msec.

15. The method of claim 13 wherein said antifuse programmer is further configured to apply a program verification pulse across the antifuse and wherein said soak pulse is followed by said program verification pulse.

16. The method of claim 15 wherein said program verification pulse has a magnitude of between about 20% and about 30% of the magnitude of the programming pulse.

17. The method of claim 10 wherein said variable duration is dependent upon the length of time required for said disruption of the antifuse material.

* * * * *